(12) United States Patent
Lim et al.

(10) Patent No.: US 7,826,000 B2
(45) Date of Patent: Nov. 2, 2010

(54) ARRAY SUBSTRATE, DISPLAY DEVICE HAVING THE SAME, AND METHOD THEREOF

(75) Inventors: Ji-Suk Lim, Daejeon (KR); Ae Shin, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 945 days.

(21) Appl. No.: 11/619,405

(22) Filed: Jan. 3, 2007

(65) Prior Publication Data

US 2007/0194317 A1 Aug. 23, 2007

(30) Foreign Application Priority Data

Feb. 17, 2006 (KR) .................. 10-2006-0015532

(51) Int. Cl.
*G02F 1/1333* (2006.01)
*G02F 1/1345* (2006.01)
(52) U.S. Cl. ............................ 349/40; 349/54; 349/151
(58) Field of Classification Search .................. 349/40, 349/54
See application file for complete search history.

(56) References Cited

U.S. PATENT DOCUMENTS

| 5,002,367 | A | * | 3/1991 | Nicholas | 349/54 |
| 5,285,301 | A | * | 2/1994 | Shirahashi et al. | 349/143 |
| 5,313,319 | A | * | 5/1994 | Salisbury | 349/40 |
| 6,043,971 | A | * | 3/2000 | Song et al. | 361/111 |
| 6,388,719 | B1 | * | 5/2002 | Matsunaga et al. | 349/40 |
| 7,724,314 | B2 | * | 5/2010 | Tanaka et al. | 349/54 |
| 2005/0225689 | A1 | * | 10/2005 | Park et al. | 349/40 |

* cited by examiner

*Primary Examiner*—David Nelms
*Assistant Examiner*—W. Patty Chen
(74) *Attorney, Agent, or Firm*—Cantor Colburn LLP

(57) ABSTRACT

An array substrate includes a base substrate, a dummy circuit section, a dummy pixel portion, an extended line, a common voltage line, and an overlap portion. Pixel portions are formed in a display area. The dummy circuit section is formed in a peripheral area to protect the pixel portions from static electricity. The dummy pixel portion is adjacent to the dummy circuit section. The dummy circuit section is in an electrically floating state. The extended line is extended from the dummy circuit section and electrically open with respect to the dummy pixel portion. The common voltage line is overlapped with the extended line of the dummy circuit section, the extended line being electrically open with respect to the display area, and thus the display area may be protected from the static electricity which flows into the dummy circuit section.

17 Claims, 5 Drawing Sheets

ARRAY SUBSTRATE, DISPLAY DEVICE HAVING THE SAME, AND METHOD THEREOF

This application claims priority to Korean Patent Application No. 2006-15532, filed on Feb. 17, 2006 and all the benefits accruing therefrom under 35 U.S.C. §119, and the contents of which in its entirety are herein incorporated by reference.

BACKGROUND OF THE INVENTION

1. Field of the Invention

The present invention relates to an array substrate, a display device having the array substrate, and a method thereof. More particularly, the present invention relates to an array substrate capable of preventing problems induced by static electricity, a display device having the array substrate, and a method of protecting a display area of a display device from static electricity.

2. Description of the Related Art

Generally, a liquid crystal display ("LCD") apparatus includes an LCD panel and a driving device driving the LCD panel. The LCD panel includes an array substrate, an opposite substrate facing the array substrate, and a liquid crystal layer interposed between the array substrate and the opposite substrate.

The array substrate includes gate lines, data lines, and thin-film transistors ("TFTs") connected to one of the gate lines and one of the data lines, respectively. As the array substrate includes metal patterns having higher degrees of integration, such as an amorphous silicon gate ("ASG") or a chip-on-glass ("COG"), many problems are induced by static electricity.

When manufacturing the array substrate and the LCD panel, the electrostatic charges generated thereon are applied to the metal patterns formed on the array substrate. The electrostatic charges cause problems such as a short circuit, a disconnection of wiring patterns, TFT damage, etc.

BRIEF SUMMARY OF THE INVENTION

The present invention provides an array substrate capable of preventing problems induced by static electricity.

The present invention also provides a display device having the above array substrate.

The present invention also provides a method of protecting a display area of a display device from static electricity.

In exemplary embodiments of the present invention, an array substrate includes a base substrate, a dummy circuit section, an extended line, a metal pattern, and an overlap portion. The base substrate includes a display area and a peripheral area surrounding the display area. A plurality of pixel portions is formed in the display area. The dummy circuit section is formed in the peripheral area. The dummy circuit section protects the pixel portions from static electricity. The extended line is extended from the dummy circuit section and formed of a first metal layer in the peripheral area. The metal pattern is formed of a second metal layer in the peripheral area. The metal pattern transmits a common voltage. The overlap portion includes the extended line and the metal pattern overlapped with each other thereon.

In other exemplary embodiments of the present invention, an array substrate includes a base substrate, a dummy circuit section, a dummy pixel portion, an extended line, a common voltage line, and an overlap portion. The base substrate includes a display area and a peripheral area surrounding the display area. A plurality of pixel portions is formed in the display area. The dummy circuit section is formed in the peripheral area. The dummy circuit section protects the pixel portions from static electricity. The dummy pixel portion is formed adjacent to the dummy circuit section in the display area. The dummy pixel portion is in an electrically floating state. The extended line is extended from the dummy circuit section and formed of a first metal layer in the peripheral area. The extended line is electrically open with respect to the dummy pixel portion. The common voltage line is formed in the peripheral area. The common voltage line transmits a storage common voltage to the pixel portions. The overlap portion includes the extended line and the common voltage line overlapped with each other thereon.

In still other exemplary embodiments of the present invention, a display device includes a first substrate, a second substrate, and a liquid crystal layer. The second substrate faces the first substrate. The second substrate includes a display area, a plurality of pixel portions formed in the display area, a dummy circuit section formed in a peripheral area surrounding the display area to protect the pixel portions from static electricity, an extended line extended from the dummy circuit section and formed of a first metal layer, a metal pattern formed of a second metal layer and transmitting a common voltage, and an overlap portion in which the extended line and the metal pattern overlap each other. The liquid crystal layer is disposed between the first and second substrates.

In yet other exemplary embodiments of the present invention, a method of protecting a display area of a display device from static electricity may include forming a dummy circuit section in a peripheral area surrounding the display area, forming an extended line from the dummy circuit section from a first metal layer, overlapping the extended line with a metal pattern formed from a second metal layer in an overlap portion in the peripheral area, the metal pattern transmitting a common voltage, and blocking electrostatic charges flowing into the dummy circuit section in the overlap portion.

According to the above, the common voltage line overlaps the extended line of the dummy circuit section, the extended line being electrically open with respect to the display area, and thus the display area may be protected from the static electricity which flows into the dummy circuit section.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION OF THE INVENTION

Figure 1:
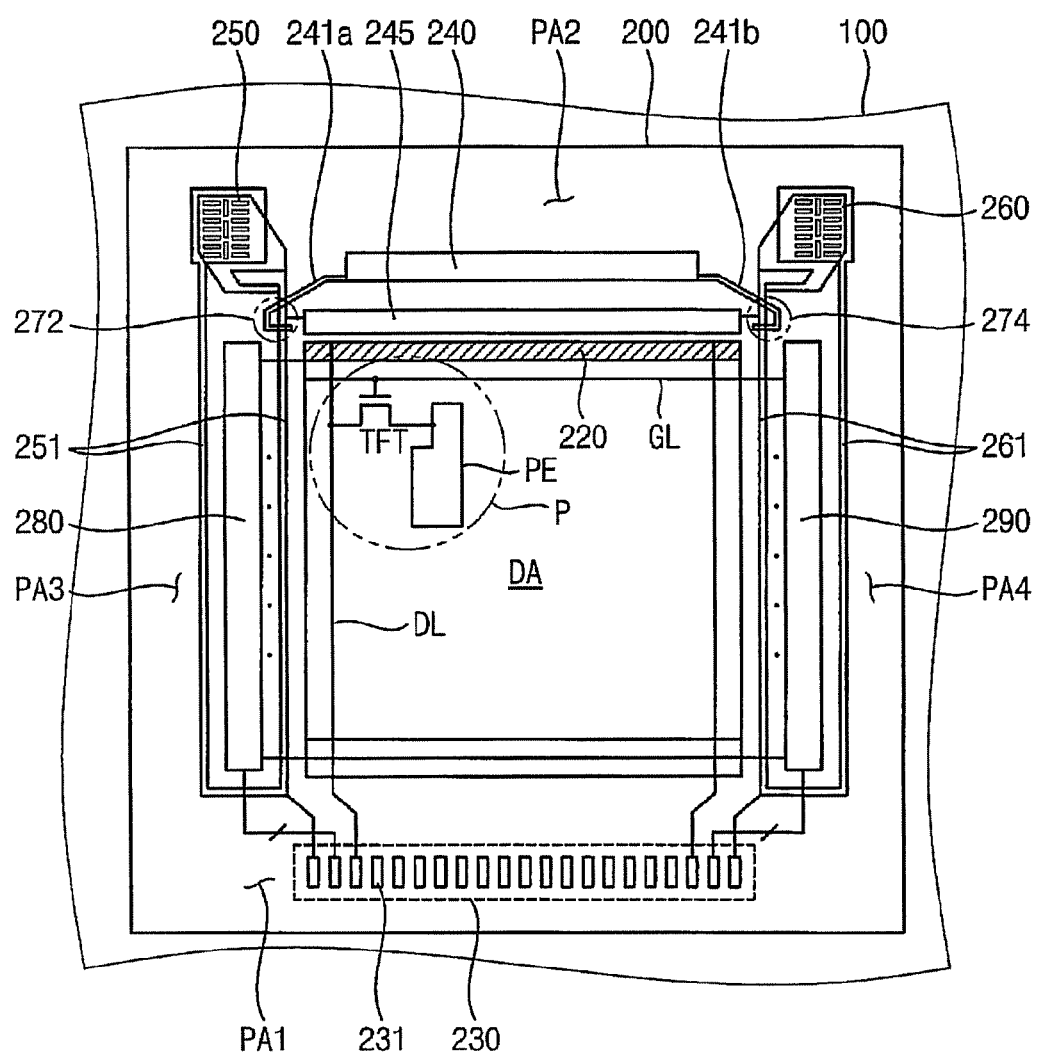
FIG. 1 is a plan view illustrating an exemplary array substrate according to an exemplary embodiment of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-sectional illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2:
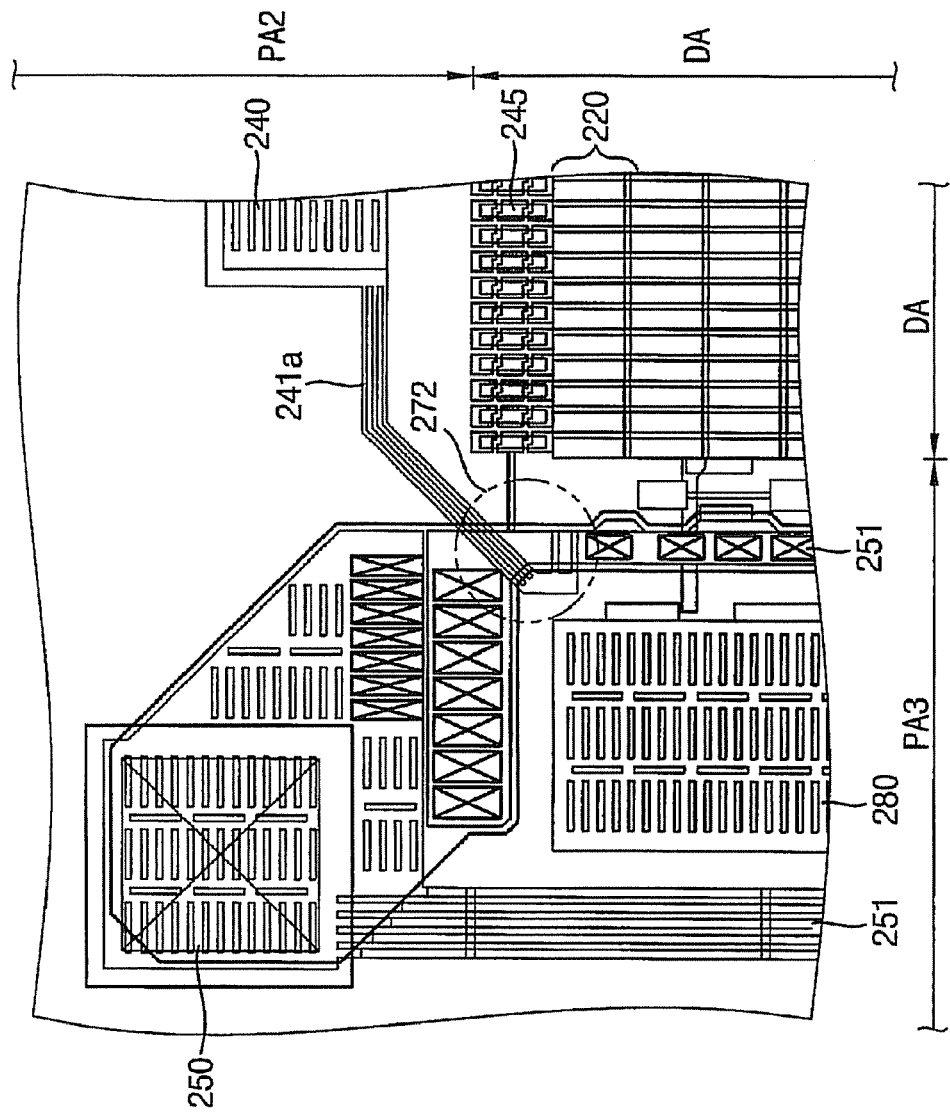
FIG. 2 is an enlarged plan view illustrating a portion of the exemplary array substrate in FIG. 1.

FIG. 1 is a plan view illustrating an exemplary array substrate according to an exemplary embodiment of the present invention, and FIG. 2 is an enlarged plan view illustrating a portion of the exemplary array substrate in FIG. 1.

Referring to FIGS. 1 and 2, an array substrate 200 is formed on a motherboard 100. The array substrate 200 includes a display area DA and a first peripheral area PA1, a second peripheral area PA2, a third peripheral area PA3 and a fourth peripheral area PA4 that surround the display area DA. The second peripheral area PA2 may be opposite the first peripheral area PA1, and the fourth peripheral area PA4 may be opposite the third peripheral area PA3.

A plurality of gate lines GL, a plurality of source lines DL also known as data lines, and a plurality of pixel portions P defined by the source lines DL and the gate lines GL are formed in the display area DA. A thin-film transistor TFT, which is a switching element, and a pixel electrode PE are formed in each of the pixel portions P. A storage capacitor (not shown) is also formed in the pixel portion P.

A dummy pixel portion 220 is formed in an end portion of the display area DA adjacent the second peripheral area PA2 to protect the pixel portions P from the static electricity. In other words, the dummy pixel portion 220, which is formed in the end portion of the pixel portions P and does not display an image, protects the pixel portions P from an inflow of electrostatic charge.

A pad portion 230 including a plurality of pads 231 is formed in the first peripheral area PA1. A driving chip outputting a driving signal to drive the pixel portions P is mounted in the pad portion 230.

A dummy circuit section 240, an electrostatic diode portion 245, a first short point 250, and a second short point 260 are formed in the second peripheral area PA2.

The dummy circuit section 240, which is a gate circuit section in a floating state, compensates for a height difference between the second peripheral area PA2 and the third and fourth peripheral areas PA3 and PA4 respectively having gate circuit sections 280 and 290 formed thereon, and prevents the static electricity. The electrostatic diode portion 245 includes a plurality of diodes connected to an end portion of the source line DL and prevents the static electricity from flowing into the display area DA through the source line DL.

The first and second short points 250 and 260 are electrically shorted with a common electrode layer of an opposite substrate (not shown) facing the array substrate 200, to apply a common voltage Vcom to the common electrode layer of the opposite substrate.

A first common voltage line 251, a first overlap portion 272, and a first gate circuit section 280 are formed in the third peripheral area PA3. The first overlap portion 272 may be adjacent the second peripheral area PA3. The first common voltage line 251 is electrically connected to the first short point 250 and a storage common electrode (not shown) of the pixel portion P, to apply a common voltage Vcom to the first short point 250 and the storage common electrode of the pixel portion P. In the first overlap portion 272, a first extended line 241a of the dummy circuit section 240 is overlapped with the first common voltage line 251, as illustrated, or the first extended line 241a is overlapped with the first short point 250.

For example, the first overlap portion 272 includes a plurality of electrostatic capacitors, each of which includes the first extended line 241a formed of a first metal layer, the first short point 250 formed of a second metal layer, and a channel layer interposed between the first and the second metal layer. Alternatively, as illustrated, the first overlap portion 272 may include a plurality of electrostatic capacitors, each of which includes the first extended line 241a formed of the first metal layer, the first common voltage line 251 formed of the second metal layer, and a channel layer interposed between the first and the second metal layer.

The first extended line 241a is electrically open with respect to the dummy pixel portion 220 formed in the display area DA. In other words, the first extended line 241a is electrically disconnected from the dummy pixel portion 220. As a result, electrostatic charges that flow into the dummy circuit section 240 are dissipated in the first overlap portion 272 before being transmitted into the display area DA, so that the pixel portions P may be protected.

The first gate circuit section 280 successively outputs gate signals to a first group of the gate lines GL. For example, the first group includes odd-numbered gate lines GL.

A second common voltage line 261, a second overlap portion 274 and a second gate circuit section 290 are formed in the fourth peripheral area PA4. The second overlap portion 274 may be formed adjacent the second peripheral area PA2. The second common voltage line 261 is electrically connected to the second short point 260 and a storage common electrode (not shown) of the pixel portion P, to transmit a common voltage Vcom to the second short point 260 and the storage common electrode of the pixel portion P. In the second overlap portion 274, a second extended line 241b of the dummy circuit section 240 is overlapped with the second short point 260 or the second common voltage line 261.

For example, the second overlap portion 274 includes a plurality of electrostatic capacitors, each of which includes the second extended line 241b formed of a first metal layer, the second short point 260 formed of a second metal layer, and a channel layer interposed between the first and the second metal layers. Alternatively, as illustrated, the second overlap portion 274 may include a plurality of electrostatic capacitors, each of which includes the first extended line 241b formed of the first metal layer and the second common voltage line 261 formed of the second metal layer, and a channel layer interposed between the first and the second metal layers.

The second extended line 241b is electrically and physically open with respect to the dummy pixel portion 220 formed in the display area DA. As a result, the electrostatic charges which flow into the dummy portion 240 are dissipated in the second overlap portion 274 before being transmitted into the display area DA, so that the pixel portions P may be protected.

The second gate circuit section 290 successively outputs gate signals to a second group of the gate lines GL. For example, the second group includes even-numbered gate lines of the gate lines GL.

Figure 3:
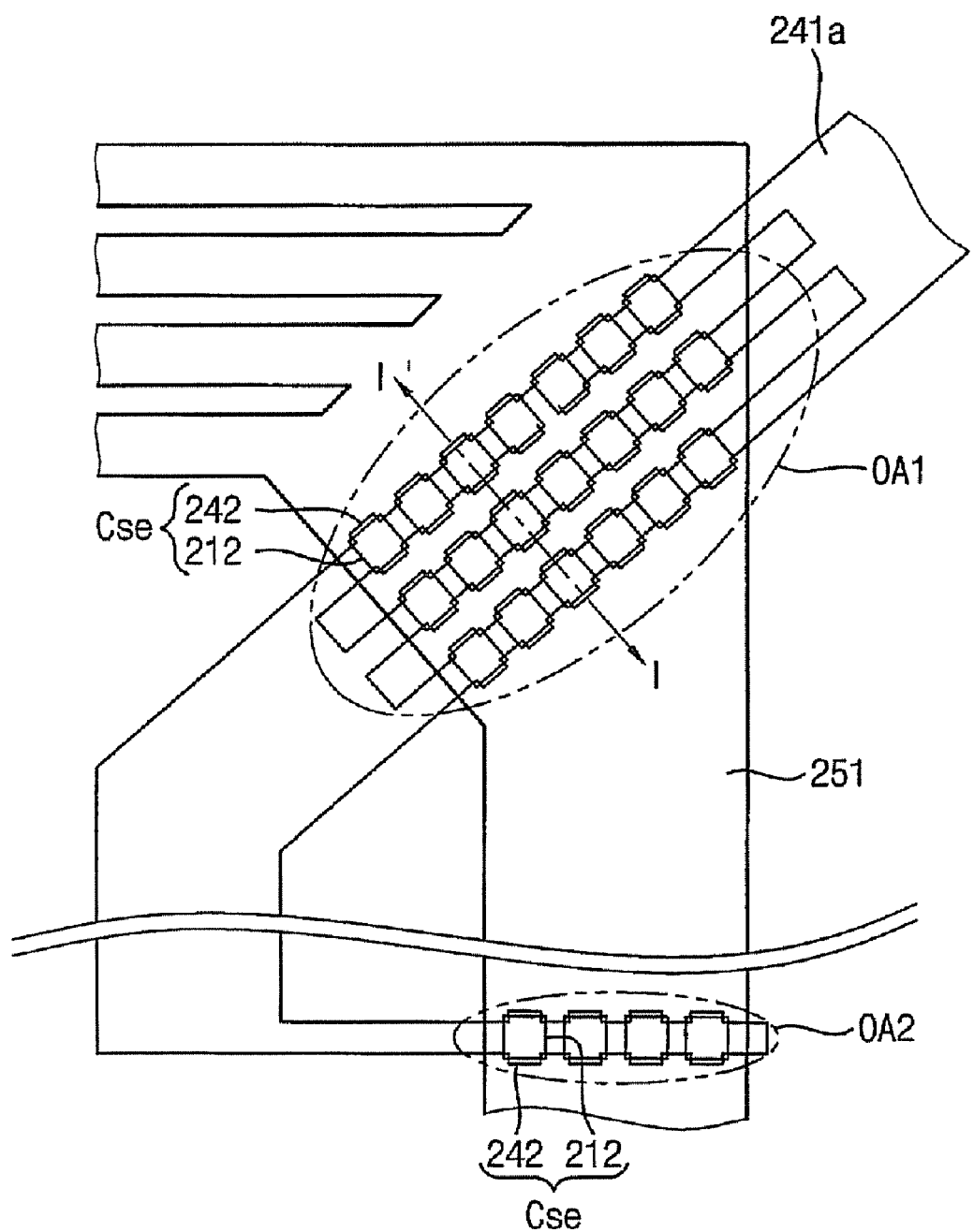
FIG. 3 is an enlarged plan view illustrating an exemplary first overlap portion in FIG. 1.
Figure 4:
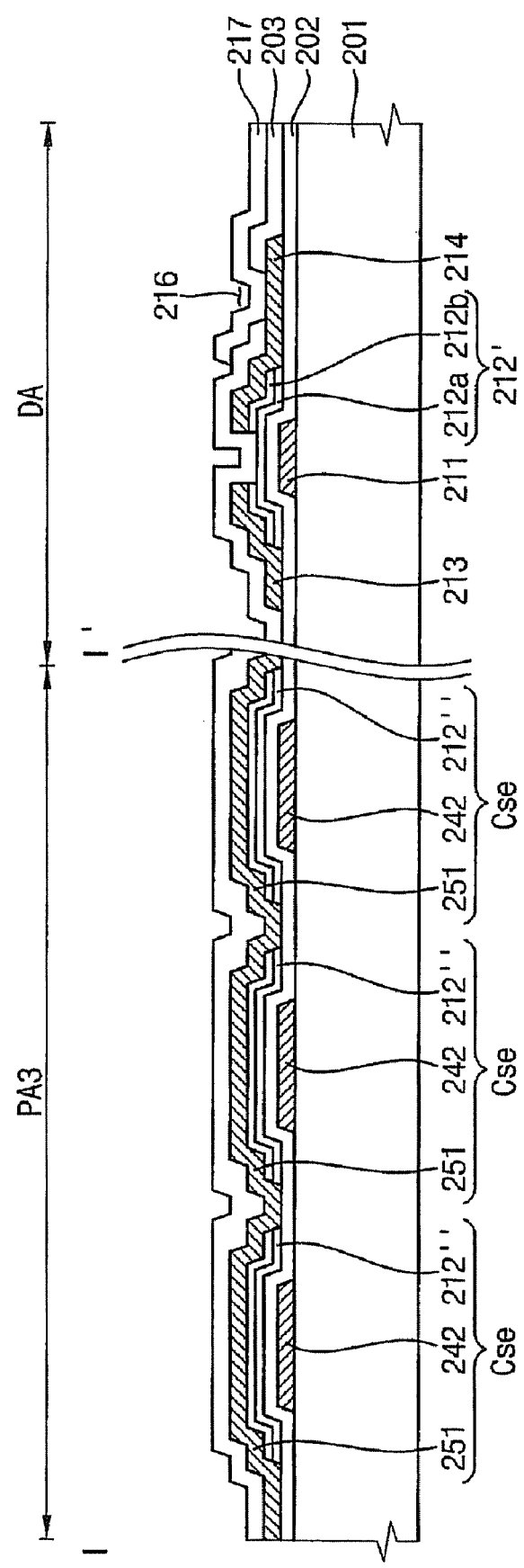
FIG. 4 is a cross-sectional view taken along line I-I' in FIG. 3.

FIG. 3 is an enlarged plan view illustrating an exemplary first overlap portion in FIG. 1, and FIG. 4 is a cross-sectional view taken along line I-I' in FIG. 3.

Referring to FIGS. 2 to 4, the first overlap portion 272 includes at least one overlap area OA1 and OA2. A plurality of electrostatic capacitors Cse is formed in each of the overlap areas OA1 and OA2.

For example, in the first overlap area OA1, the first extended line 241a formed of the first metal layer and extended from the dummy circuit section 240 crosses over and is overlapped with the first common voltage line 251 formed of the second metal layer and electrically connected to the first short point 250. A plurality of electrostatic capacitors Cse is formed in the first overlap area OA1.

Each of the electrostatic capacitors Cse is defined by an electrode pattern 242 formed by patterning the first extended line 241a, a channel pattern 212 formed on the electrode pattern 242, and the first common voltage line 251 formed on the channel pattern 212. For example, the first extended line 241a may extend from the dummy circuit section 240 and may be subdivided into thinner line portions in an area to be overlapped by the first common voltage line 251. The thinner line portions may include expansions forming the electrode patterns 242, and the channel patterns 212 may overlap the expansions.

A plurality of electrostatic capacitors Cse, each of which includes the first extended line 241a and the first common voltage line 251 is formed in each of the overlap areas OA1 and OA2. For example, the first metal layer is a gate metal layer and the second metal layer is a source metal layer. That is, the first extended line 241a may be formed in a same layer of the display device as the gate lines GL and the first common voltage line 251 may be formed in a same layer of the display device as the data lines DL.

Referring to FIG. 4, the array substrate includes a base substrate 201 having the display area DA and the third peripheral area PA3.

The gate line GL and the gate electrode 211 of the thin-film transistor TFT, which include the gate metal layer, are formed on the base substrate 201. The storage common electrode of the storage capacitor may also be formed of the gate metal layer on the base substrate 201.

The first extended line 241a is also formed of the gate metal layer in the third peripheral area PA3 on the base substrate 201. A plurality of the electrode patterns 242 is formed by patterning the first extended line 241a corresponding to the first overlap portion 272. A gate insulation layer 202 is formed on the electrode patterns 242, the gate electrode 211, and exposed portions of the base substrate 201. The first extended line 241a is electrically and physically open with respect to the dummy pixel portion 220 formed in the display area DA.

After forming the gate insulation layer 202 on the base substrate 201 on which the gate metal layer is formed, the channel layer is formed on the gate insulation layer 202. For example, the channel layer includes an active layer 212a including amorphous silicon ("a-Si"), and an ohmic contact layer 212b including n+a-Si with high density dopants.

By patterning the channel layer, a first channel pattern 212' is formed on the gate electrode 211 of the thin-film transistor TFT in the display area DA, and a second channel pattern 212" is formed on the electrode pattern 242 in the peripheral area PA3. Each of the first channel pattern 212' and the second channel pattern 212" may include the active layer 212a and the ohmic contact layer 212b.

The source line DL, the source electrode 213 of the thin-film transistor TFT and the drain electrode 214, which include the second metal layer, are formed on the base substrate 201 on which the first channel pattern 212' and the second channel pattern 212" are formed. The first common voltage line 251 electrically connected to the first short point 250 is also formed from the second metal layer and is formed in the third peripheral area PA3.

A plurality of electrostatic capacitors Cse is formed by the electrode patterns 242 formed on the extended line 241a, the second channel pattern 212" and the first common voltage line 251 in the third peripheral area PA3.

Then, a protecting insulation layer 203 is formed on the base substrate 201, more particularly, the protecting insulation layer 203 is formed on the first common voltage line 251, the source electrode 213, the drain electrode 214, an exposed portion of the active layer 212a of the first channel pattern 212' located between the source electrode 213 and the drain electrode 214 on the gate electrode 211, and on exposed portions of the gate insulation layer 202. A contact hole 216 is formed through the protecting insulation layer 203 of the display area DA corresponding to each of the pixel portions to expose the drain electrode 214 of each pixel portion. A pixel electrode 217 is electrically connected to the drain electrode 214 through the contact hole 216.

The first extended line 241a is electrically and physically open with respect to the dummy pixel portion 220 formed in the display area DA. As a result, electrostatic charges which flow into the dummy circuit section 240 are dissipated in the overlap areas OA1 and OA2 before being transmitted into the display area DA, so that the pixel portions P may be protected.

Figure 5:
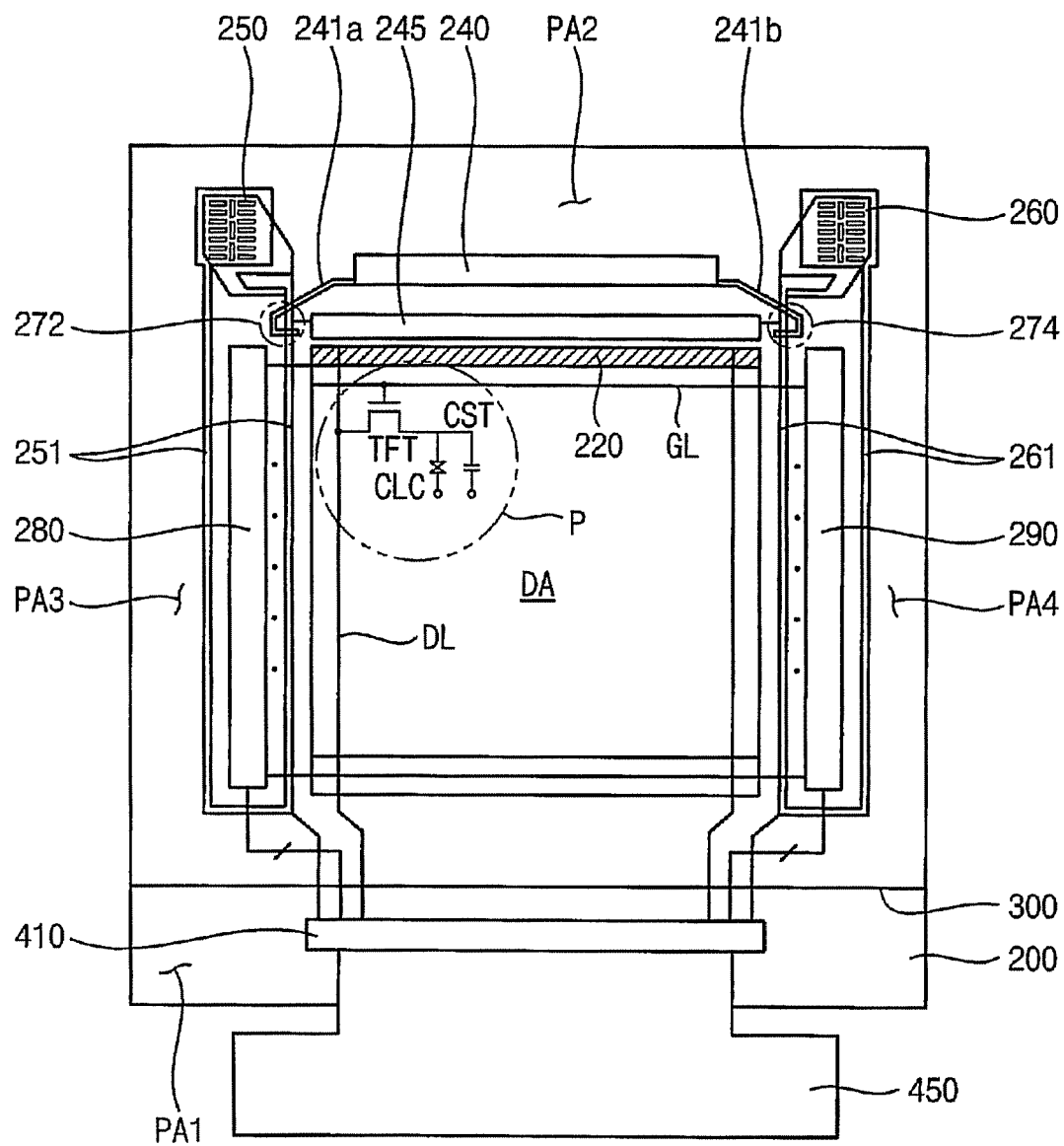
FIG. 5 is a plan view illustrating an exemplary display device according to an exemplary embodiment of the present invention.

FIG. 5 is a plan view illustrating an exemplary display device according to an exemplary embodiment of the present invention.

Referring to FIGS. 1 and 5, the display device includes a display panel and a driving device driving the display panel.

The display panel includes an array substrate 200, an opposite substrate 300 facing the array substrate 200, and a liquid crystal layer (not shown) interposed between the array substrate 200 and the opposite substrate 300. The opposite substrate 300 may also be referred to as a common electrode panel or a color filter panel. The display panel includes the display area DA in which a plurality of the pixel portions P is formed and the first, second, third, and fourth peripheral areas PA1, PA2, PA3, and PA4 that surround the display area DA. Each of the pixel portions P includes a switching element TFT, a liquid crystal capacitor CLC electrically connected to the switching element TFT, and a storage capacitor CST electrically connected to the liquid crystal capacitor CLC.

A driving chip 410 is mounted in the first peripheral area PA1. A dummy circuit section 240, an electrostatic diode portion 245, a first short point 250, and a second short point 260 are formed in the second peripheral area PA2. A first common voltage line 251, a first overlap portion 272, and a first gate circuit section 280 are formed in the third peripheral area PA3. A second common voltage line 261, a second overlap portion 274, and a second gate circuit section 290 are formed in the fourth peripheral area PA4.

In the first and the second overlap portions 272 and 274, a first extended line 241a and a second extended line 241b of the dummy circuit section 240 are overlapped with the first short point 250 and the second short point 260, respectively, or alternatively, the first extended line 241a and the second extended line 241b are overlapped with the first common voltage line 251 and the second common voltage line 261, respectively. A plurality of electrostatic capacitors Cse is formed in the first and the second overlap portions 272 and 274, respectively, as previously described.

As a result, electrostatic charges that flow into the dummy circuit section 240 are dissipated in the first and the second overlap portions 272 and 274, before being transmitted into the display area DA, so that the pixel portions P in the display area DA may be protected.

The first extended line 241a and the second extended line 241b are electrically open with respect to the dummy pixel portion 220 formed in the display area DA. As a result, electrostatic charges are dissipated in the first and second overlap portions 272 and 274 to thereby prevent residual electrostatic charges flowing into the display area DA.

The driving device includes the driving chip 410 mounted in the first peripheral area PA1 of the array substrate 200, and a flexible printed circuit board 450 connecting the driving chip 410 to an external device. The driving device includes the first and the second gate circuit sections 280 and 290 receiving a driving signal outputted by the driving chip 410.

Although the above preferred embodiments disclose an array substrate having gate circuit sections, lines, and overlap portions symmetrically formed in the third and the fourth peripheral areas, respectively, the array substrate may include the gate circuits, lines, and overlap portions formed only in the third peripheral area.

A method of protecting a display area of a display device from static electricity may thus include forming a dummy circuit section in a peripheral area surrounding the display area, forming an extended line from the dummy circuit section from a first metal layer, overlapping the extended line with a metal pattern formed from a second metal layer in an overlap portion in the peripheral area, the metal pattern transmitting a common voltage, and blocking electrostatic charges flowing into the dummy circuit section in the overlap portion. The method may further include forming electrostatic capacitors in the overlap portion, each electrostatic capacitor including an electrode pattern formed from the extended line, a channel pattern formed on the electrode patterns, and the metal pattern formed on the channel pattern, and the method may further include forming a dummy pixel portion in the display area, wherein the extended line is electrically open with respect to the dummy pixel portion.

According to the present invention, an array substrate includes the dummy circuit section that is adjacent to a display area to protect the display area from static electricity, and the overlap portion where an extended line extended from the dummy circuit section is overlapped with a short point or a common voltage line electrically connected to the short point. Therefore, electrostatic charges that flow into the dummy circuit section are dissipated in the overlap portion.

The extended line is formed to be electrically and physically open with the display area. Therefore, electrostatic charges that flow into the dummy circuit section are blocked in the overlap portion before being transmitted into the display area, so that a pixel portion may be protected.

Although the exemplary embodiments of the present invention have been described, it is understood that the present invention should not be limited to these exemplary embodiments but various changes and modifications can be made by one of ordinary skill in the art within the spirit and scope of the present invention as hereinafter claimed.

What is claimed is:

1. An array substrate comprising:
    a base substrate including a display area having a plurality of pixel portions, and a peripheral area surrounding the display area;
    a dummy circuit section formed in the peripheral area, the dummy circuit section protecting the pixel portions from static electricity;
    an extended line extended from the dummy circuit section and formed of a first metal layer in the peripheral area;
    a metal pattern formed of a second metal layer in the peripheral area, the metal pattern transmitting a common voltage; and
    an overlap portion in which the extended line and the metal pattern are overlapped with each other,
    wherein the overlap portion comprises a plurality of capacitors.

2. The array substrate of claim 1, wherein the metal pattern is a common voltage line transmitting the common voltage to the pixel portions.

3. The array substrate of claim 1, wherein the metal pattern is a short point transmitting the common voltage to an opposite substrate facing the array substrate.

4. The array substrate of claim 1, further comprising a dummy pixel portion formed in the display area, the dummy pixel portion being in an electrically floating state.

5. The array substrate of claim 4, wherein the extended line is electrically open with respect to the dummy pixel portion.

6. The array substrate of claim 1, wherein the capacitors are formed by the extended line, a channel pattern formed on the extended line, and the metal pattern formed on the channel pattern.

7. The array substrate of claim 1, wherein electrostatic charges flowing into the dummy circuit Section are blocked in the overlap portion before being transmitted into the display area.

8. The array substrate of claim 1, wherein the display area includes a plurality of gate lines formed from the first metal layer and a plurality of source lines formed from the second metal layer.

9. An array substrate, comprising:
    a base substrate including a display area having a plurality of pixel portions, and a peripheral area surrounding the display area;
    a dummy circuit section formed in the peripheral area, the dummy circuit section protecting the pixel portions from static electricity;
    a dummy pixel portion formed adjacent to the dummy circuit section and formed in the display area, the dummy pixel portion being in an electrically floating state;
    an extended line extended from the dummy circuit section and formed of a first metal layer in the peripheral area, the extended line being in an electrically floating state;
    a common voltage line formed in the peripheral area, the common voltage line transmitting a storage common voltage to the pixel portions; and
    an overlap portion in which the extended line and the common voltage line are overlapped with each other,
    wherein the overlap portion comprises a plurality of capacitors.

10. The array substrate of claim 9, wherein the overlap portion comprises at least one capacitor formed by the extended line, a channel pattern formed on the extended line, and the common voltage line formed on the channel pattern.

11. A display device comprising:
    a first substrate;
    a second substrate facing the first substrate, the second substrate including:
        a display area having a plurality of pixel portions formed thereon;
        a dummy circuit section formed in a peripheral area surrounding the display area, the dummy circuit section protecting the pixel portions from static electricity;
        an extended line extended from the dummy circuit section and formed of a first metal layer;
        a metal pattern formed of a second metal layer, the metal pattern transmitting a common voltage; and
        an overlap portion in which the extended line and the metal pattern are overlapped with each other; and
    a liquid crystal layer disposed between the first and second substrates,
    wherein the overlap portion comprises a plurality of capacitors.

12. The display device of claim 11, wherein the metal pattern is a common voltage line transmitting the common voltage to the pixel portions.

13. The display device of claim 11, wherein the metal pattern is a short point transmitting the common voltage to a common electrode layer formed on the first substrate.

14. The display device of claim 11, wherein the second substrate further comprises a dummy pixel portion formed in the display area adjacent to the dummy circuit section, the dummy pixel portion being in an electrically floating state.

15. The display device of claim 14, wherein the extended line is electrically open with respect to the dummy pixel portion.

16. A method of protecting a display area of a display device from static electricity, the method comprising:
    forming a dummy circuit section in a peripheral area surrounding the display area;
    forming an extended line from the dummy circuit section from a first metal layer;
    overlapping the extended line with a metal pattern formed from a second metal layer in an overlap portion in the peripheral area, the metal pattern transmitting a common voltage;
    forming electrostatic capacitors in the overlap portion, each electrostatic capacitor including an electrode pattern formed from the extended line, a channel pattern formed on the electrode patterns, and the metal pattern formed on the channel pattern; and
    blocking electrostatic charges flowing into the dummy circuit section in the overlap portion.

17. The method of claim 16, further comprising forming a dummy pixel portion in the display area, wherein the extended line is electrically open with respect to the dummy pixel portion.

* * * * *